United States Patent
Kawai et al.

(10) Patent No.: US 6,569,524 B2
(45) Date of Patent: May 27, 2003

(54) HIGH THERMAL CONDUCTIVITY COMPOSITE MATERIAL, AND METHOD FOR PRODUCING THE SAME

(75) Inventors: Chihiro Kawai, Itami (JP); Hirohiko Nakata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/886,617

(22) Filed: Jun. 22, 2001

(65) Prior Publication Data

US 2002/0041959 A1 Apr. 11, 2002

(30) Foreign Application Priority Data

Apr. 26, 2001 (JP) .......................................... 2001-129070
Jun. 23, 2001 (JP) .......................................... 2000-189943

(51) Int. Cl.[7] .............................. D02G 3/00; C22C 29/00
(52) U.S. Cl. ..................... 428/375; 428/689; 428/697; 428/698; 75/229; 75/230; 75/236
(58) Field of Search ................................ 428/357, 364, 428/368, 375, 689, 697, 698; 75/229, 230, 236

(56) References Cited

U.S. PATENT DOCUMENTS 3,894,863 A * 7/1975 Lachman et al. ............. 75/0.5
4,083,719 A * 4/1978 Arakawa et al. ............. 75/229
5,874,175 A * 2/1999 Li ............................... 428/457
6,238,454 B1 * 5/2001 Polese et al. ................. 75/243

FOREIGN PATENT DOCUMENTS

JP  10-223812  8/1998
JP  11-067991  3/1999

* cited by examiner

*Primary Examiner*—Deborah Jones
*Assistant Examiner*—G. A. Blackwell-Rudasill
(74) *Attorney, Agent, or Firm*—McDermott, Will & Emery

(57) ABSTRACT

The present invention provides a composite material having comparatively high thermal conductivity and a small coefficient of thermal expansion, which is low cost and preferable as a heatsink material. A graphite powder and an alloy powder, whose main constituent is Ag and Cu, and including Ti, etc., which is selected from the elements belonging to 4A, 5A and 6A groups, are blended together, and are heated at a higher temperature than the melting point of the alloy in a vacuum state or in a gas atmosphere of He, Ar or hydrogen. A coating layer of metal carbide such as TiC is formed on the surface of the graphite grains, and at the same time, they are transformed into a sintered body. The composite material thus obtained is such that the relative density thereof is 70% or more, thermal conductivity thereof is 220 W/m·K or more at room temperature, and the mean coefficient of thermal expansion from the room temperature to 200° C. is 5 through $15 \times 10^{-6}$/°C. Therefore, the composite material is best suitable as heatsink members for semiconductors. In addition, carbide powder such as carbon fibers or SiC may be used instead of graphite powder.

12 Claims, 1 Drawing Sheet

HIGH THERMAL CONDUCTIVITY COMPOSITE MATERIAL, AND METHOD FOR PRODUCING THE SAME

BACKGROUND OF THE INVENTION

1. Field of the Invention

The present invention relates to a composite material having high thermal conductivity, which is used as a heatsink material for semiconductor devices, and a method for producing the same.

2. Description of the Prior Art

Generally speaking, in order to radiate heat generated from incorporated semiconductor elements, a heatsink made of a high thermal conductivity material is attached to a semiconductor device. The standard of physical properties required for a heatsink material is such that the thermal conductivity is equivalent to or more than that of Cu (395 W/m·K) and the coefficient of thermal expansion is lower than that of Cu ($16.9 \times 10^{-6}$/°C.).

Conventionally, $Al_2O_3$ and AlN whose coefficient of thermal expansion is approximate to that of a semiconductor element have been used as a heatsink material in spite of their comparatively low thermal conductivity because conventional electronic components incorporating semiconductor elements such as semiconductor lasers, microwave elements, etc., have generated only a slight amount of heat.

Recently, however, in line with an increase in the amount of information, semiconductor elements have been increased in size, and the output thereof has been highly increased. As a result, an increase in the amount of heat generation causes a problem. For Example, AlN has consistently been used till recently because it has comparatively satisfactory thermal conductivity as well as the coefficient of thermal expansion similar to that of Si and InP, but AlN can no longer meet further increase in the output and size of semiconductor elements in view of its thermal conductivity. Therefore, recently, in order to incorporate these semiconductor elements having high output, heatsink materials having remarkably excellent thermal conductivity are demanded.

Further, in view of the coefficient of thermal expansion, AlN is not suitable as a heatsink material for semiconductor elements that are composed of material, such as GaAs, which has a large coefficient of thermal expansion. In detail, the coefficient of thermal expansion of various types of semiconductor materials is expressed in terms of $\times 10^{-6}$/°C. (hereinafter expressed in terms of ppm/°C.), wherein Si is 4.2, InP is 4.5, and GaAs is 5.9 or so. Therefore, it is recommended that the coefficient of thermal expansion of heatsink materials is close to these figures. In addition, a heatsink material preferably should have a low Young's modulus so that the generation of thermal stress is reduced.

Although the material having the highest thermal conductivity is diamond and c-BN (cubic boron nitride), their coefficient of thermal expansion is very low, wherein that of diamond is 2.3 ppm/°C. and that of c-BN is 3.7 ppm/°C., and the Young's modulus of these materials is very high to be 830 through 1050 GPa. Therefore, a large thermal stress occurs when brazing a heatsink and a semiconductor element together or between the heatsink and semiconductor element when being used as a device, wherein a breakage is likely to occur.

Recently, various types of composite materials such as Al—SiC, in which ceramic and metal are composed together, have been proposed as a heatsink material having a low coefficient of thermal expansion as well as comparatively high thermal conductivity. However, since the thermal conductivity of Al is as low as approx. 238 W/m·K at room temperature, there exists an upper limit in the thermal conductivity of a composite material including Al, which results in the failure to meet the recent requirements for high thermal conductivity such as described above. The composite material cannot meet recent requirements in order to achieve the high thermal conductivity as described above. It may be considered that metals having high thermal conductivity such as Cu (395 W/m·K at room temperature) and Ag (420 W/m·K at room temperature) are used instead of Al. However, since the wettability thereof with SiC is very inferior, the high thermal conductivity that is inherent in Cu and Ag cannot be sufficiently displayed.

Japanese Unexamined Patent Publication No. 11-67991 discloses a diamond-Ag based or diamond-Cu based composite material as a heatsink material having improved wettability with Cu and Ag. According to the disclosed invention, a diamond powder and Ag—Cu—Ti based powder are blended together and molded, and then are heated at a higher temperature than the melting point of the resultant alloy. This allows Ti constituents to diffuse on the surface of diamond grains and to react to form a TiC film on the surface (sintering method). Since the TiC has good wettability with Cu or melted Ag, the phase boundaries of the diamond grains and the metal are adhered close to each other, whereby high thermal conductivity can be obtained.

Also, an infiltration method is disclosed in Japanese Unexamined Patent Publication No. 10-223812 as a method for producing such a diamond-Ag based or diamond-Cu based composite material. In this method, after diamond powder and Ag—Cu—Ti based powder are blended and molded, the molded body is heated at a higher temperature than the melting point of the corresponding alloy to form a TiC layer on the surface of diamond grains. After that, the molded body is further heated to elute and volatilize the Ag constituents and Cu constituents, thereby producing a porous body. Impregnating the porous body with an Ag—Cu alloy produces a composite material having a higher relative density and a higher thermal conductivity than that obtained by the sintering method.

However, there are common problems in the case of the above-described diamond-Ag based and diamond-Cu based composite materials: (1) the diamond is remarkably expensive, (2) the diamond has very high hardness, which allows a large thermal stress to remain at the phase boundary of bonding between the composite material and semiconductor element due to a high Young's modulus as described above, and (3) metal molding dies are remarkably worn when a blended powder including diamond is molded. Resultantly, the cost of a diamond-Ag based and diamond-Cu based composite material becomes very high, and it is very difficult to employ the same in practical applications. Also, (4) even if the infiltration method is employed, a problem still remains, it is difficult to make the diamond-Ag based and diamond-Cu based composite materials completely dense.

SUMMARY OF THE INVENTION

The present invention was developed in views of these situations, and it is therefore an object of the invention to provide, without the use of expensive diamond, a composite material that is favorable when it is used as a heatsink material while it is low cost, has a low coefficient of thermal expansion and has comparatively high thermal conductivity.

In order to achieve the above-described object, the invention provides a high thermal conductivity composite material consisting of a first constituent composed of composite carbon grains, composite carbon fibers, or composite carbide grains, which have a coating layer formed on the surface thereof, and a second constituent composed of a metal including silver and/or copper; wherein the coating layer formed on the surface of the composite carbon grains, composite carbon fibers, or composite carbide grains, which are the first constituent, is composed of carbide of at least a type of metal selected from the group consisting of 4A group elements, 5A group elements, and 6A group elements of the periodic table. The high thermal conductivity composite material has a relative density of 70% or more, thermal conductivity of 220 W/m·K or more at least in a specified direction at room temperature, and a mean coefficient of thermal expansion of 5 through $15 \times 10^{-6}/°C$. from room temperature to 200° C. at least in a specified direction.

In the above-described high thermal conductivity composite material according to the invention, where the first constituent is made of composite carbon grains having a coating layer formed on the surface thereof or composite carbon fiber having the same, it is preferable that the ratio of content of the carbon grains or carbon fibers is 30 through 95% by volume fraction. Also, where the above-described first constituent is composite carbide grains having a coating layer formed on the surface thereof, it is preferable that the ratio of content of the carbide grains is 15 through 85% by volume fraction.

In the above-described high thermal conductivity composite material according to the invention, it is preferable that the coating layer formed on the surface of the above-described first constituent is titanium carbide, and the thickness of the coating layer formed on the surface of the first constituent is 0.01 through 3 $\mu$m, preferably 0.05 through 1 $\mu$m. And, where the second constituent is made of silver or copper, it is preferable that the ratio of content of copper in the second constituent is 20% by volume fraction or less or 80% by volume fraction or more. Since the thermal conductivity of an Ag—Cu alloy is lowered unless the above-described alloy composition is obtained, there is a tendency that the thermal conductivity of the composite material is lowered.

In the high thermal conductivity composite material according to the invention, preferably, the relative density is 95% or more, and the thermal conductivity is 250 W/m·K or more at least in a specified direction at room temperature. More preferably, the relative density is 99% or more, and the thermal conductivity is 270 W/m·K or more at least in a specified direction at room temperature.

Such a high thermal conductivity composite material according to the invention is preferably used as a semiconductor heatsink member. In addition, the present invention provides a semiconductor apparatus using a semiconductor heatsink member made of the above-described high thermal conductivity composite material.

The present invention provides a method for producing a high thermal conductivity composite material comprising a first constituent composed of composite carbon grains, composite carbon fibers, or composite carbide grains, which have a coating layer formed on the surface thereof, and a second constituent composed of a metal including silver and/or copper. That is, the method for producing a composite material based on a sintering method according to the invention comprises the first step of preparing graphite powder, carbon fibers, or carbide powder, and simultaneously preparing alloy powder including at least a type of metals selected from the elements belonging to 4A, 5A and 6A groups, whose main constituent is silver and/or copper, of the periodic table; the second step of molding a mixture of the powder and making the same into a molded body; and the third step (3a) of heating the molded body in a vacuum state whose pressure is 0.0133 Pa or less, or in a gas atmosphere containing helium, argon or hydrogen at a higher temperature than the melting point of the alloy, forming a coating layer consisting of at least a type of metal carbides selected from the elements belonging to 4A, 5A and 6A groups of the periodic table on the surface of graphite grains, carbon fibers or carbide grains; and simultaneously making the same into a sintered body.

Further, the invention provides a method for producing the above-described high thermal conductivity composite material based on the infiltration method. That is, the producing method on the basis of the infiltration method comprises the first step of preparing graphite powder, carbon fibers, or carbide powder, and simultaneously preparing alloy lumps or alloy powder or a molded body thereof including at least a type of metals selected from the elements belonging to 4A, 5A and 6A groups, whose main constituent is silver and/or copper, of the periodic table; the second step of molding the graphite powder, carbon fibers, or carbide powder and making the same into a molded body; and the third step (3b) of bringing the molded body into contact with the alloy lumps or alloy powder or their molded body, heating the same at a higher temperature than the melting point of the alloy in a vacuum state whose pressure is 0.0133 Pa or less, or in a gas atmosphere including helium, argon or hydrogen, forming a coating layer composed of at least a type of metal carbides, which is selected from the elements belonging to 4A, 5A and 6A groups of the periodic table, on the surface of graphite grains, carbon fibers, or carbide grains, and simultaneously making the same into a sintered body, and infiltrating the melted alloy into the sintered body. In the method for producing a high thermal conductivity composite material according to the invention, wherein, after a part of metal is eluted or volatilized by increasing the sintering temperature or lengthening the sintering time in the third step 3a or 3b to make the same into a porous body, the porous body is brought into contact with metal lumps or metallic powder of silver and/or copper or their molded body, and is heated at a higher temperature than the melting point of the metal in a non-oxidized atmosphere, and the melted metal is infiltrated into the porous body to make the same into an infiltrated body. Also, the sintered body that is obtained in the third a or b step may be preheated at a higher temperature than the melting point of the metal in the sintered body in the atmosphere or an inert gas atmosphere, and may be forged with a pressure equivalent to 600 MPa or more.

In the above-described method for producing a high thermal conductivity composite material according to the invention, the heating temperature in the third step exceeds the melting point of the alloy powder and is (the melting point plus 50)°C. or less. Also, in each of the second steps of the respective producing methods, it is preferable that the molded body is obtained through a hydrostatic pressure molding process in a cold or hot state. At this time, it is preferable that the molding pressure is 300 MPa or more.

Still further, the invention provides a method for producing a high thermal conductivity composite material composed of a first constituent consisting of composite silicon carbide grains having a coating layer formed on the surface thereof, and a second constituent consisting of a metal consisting of silver and/or copper. That is, the method comprises the steps of: pressurizing and sintering silicon carbide powder at a higher temperature than 2000° C. in an inert gas atmosphere or a vacuum state, and forming a porous body of silicon carbide; and bringing the porous body of silicon carbide into contact with an alloy lump or alloy powder, whose main constituent is silver and/or copper, including at least a type of metals selected from the elements belonging to 4A, 5A and 6A groups of the periodic table, or its molded body, heating the porous body at a higher temperature than the melting point of the alloy in a vacuum state whose pressure is 0.0133 Pa or less or a gas atmosphere of helium, argon or hydrogen, forming a coating layer consisting of at least a type of metal carbides selected from the elements belonging to 4A, 5A and 6A groups of the periodic table on the surface of silicon carbide grains, and simultaneously infiltrating the melted alloy into the porous body.

In the above-described method for producing the high thermal conductivity composite material, after the obtained composite material is heated at a higher temperature than the infiltrating temperature and a part of the metal is eluted and volatilized to make the same into a porous body again, the porous body is brought into contact with a metal lump of silver and/or copper, or metallic powder thereof, or its molded body, and is heated to a higher temperature than the melting point of the metal in a non-oxidized atmosphere, and the melted metal is infiltrated into the porous body.

Therefore, the present invention is able to provide a composite material having comparatively high thermal conductivity with the coefficient of thermal expansion limited, without the use of any expensive diamond. Also, with the composite materials according to the invention, it is possible to produce heatsink members whose thermal conductivity is high as in diamond and whose coefficient of thermal expansion is very close to that of semiconductor elements. By using the heatsink members, it is possible to display fill performance of semiconductor lasers, microwave devices, and various types of LSI.

DETAILED DESCRIPTION OF THE PREPARED EMBODIMENTS

Figure 1:
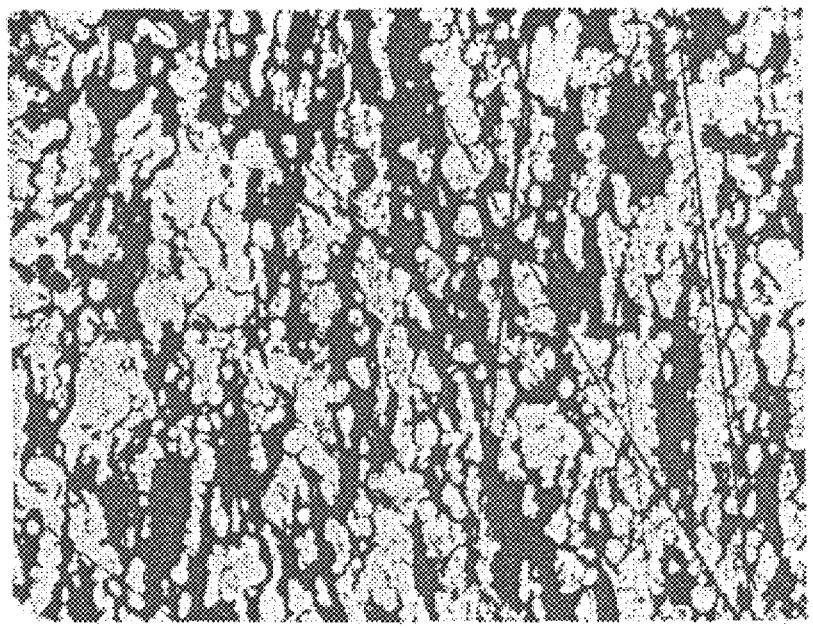
FIG. 1 is a photograph of a representative texture of an Ag—Cu based composite material according to the invention, which was taken by an optical microscope in magnification of 100 times.

The inventors examined and studied production of composite materials that do not use any diamond, which causes various problems in the above-described diamond-Ag based and/or diamond-Cu based composite material, do not greatly lower the thermal conductivity, but is inexpensive in the production cost. They examined a contact angle between a melted metal and a solid, considering it as a factor that controls the wettability, and made the present invention on the basis of the following judgement.

That is, with respect to properties of material, (1) graphite which is the same carbon as diamond, has almost the same contact angle with Ag or Cu, (2) graphite has remarkably high thermal conductivity in a specified crystalline direction, (3) high thermal conductivity can be generated by controlling the thickness of a TiC layer that is a coating layer, and (4) the wearing of metal molds at the time of molding can be reduced to almost zero by using graphite. Further, with respect to process, (5) the crystalline plane of graphite powder can be oriented by keeping the molding pressure at a given level or more, (6) almost 100% relative density as well as higher thermal conductivity can be obtained by using a hot forging process.

Based on the above discovery, graphite is used as a constituent to make a composite with Ag or Cu in the present invention. Preferably, a powder having a high graphitizing degree is used as a graphite powder, such as a mesophased pitch based graphite powder, thermally decomposed graphite powder, or natural graphite powder. Especially preferable thermally decomposed graphite powder can be obtained by, for example, the following process. That is, a hydrogen carbide gas such as methane and propane, etc., is thermally decomposed, and graphite is accumulated on a substrate, a lump thereof is produced by heat treatment at a temperature of 3000° C. or more, and such powder is obtained by finally crushing and pulverizing the lump thereof. The slighter the amount of impurities is, the better the graphite becomes. For example, the thermally decomposed graphite powder is made highly pure through a heat treatment at 3000° C. or more in the production process, in which Fe, Si, Al, Ca, V, As, Sb, Cr, Mo, Cu, Co, Pb, Ni, Sn, Cd, Mn, etc, that are impurities are volatilized.

The metal to be made composite with graphite includes Ag and/or Cu as its main constituent, and includes at least a type of metal selected from the group consisting of 4A group elements, 5A group elements, and 6A group elements of the periodic table. An Ag-based alloy is the most preferable as such a metal. For example, an activated silver solder powder, in which the above-described metal element, such as Ti, is added to Ag may be used. Since there is an effect of lowering the melting point of the alloy if a Cu constituent is added thereto, the sintering temperature can be set to be low, which results in the saving of energy. Where Cu is doped to Ag, it is preferable that the Cu concentration with respect to the total amount of Cu and Ag is 20% by volume fraction or less or 80% by volume fraction or more. If the Cu concentration is not at such ratios, the thermal conductivity of the composite material is lowered by a decrease in the thermal conductivity of the Ag—Cu alloy. Also, in the same viewpoint, activated copper solder powder in which Ti is doped to Cu may be used.

As the Ti concentration in the metal constituent is increased, a coating layer of TiC, etc., which is formed on the surface of graphite powder becomes thick. To the contrary, as the Ti concentration is decreased, the TiC layer becomes thin, and the wettability with a melted metal constituent is lowered. When it is desired that the Ti concentration be increased, the Ti concentration in activated Ag solder or activated Cu solder may be increased. However, since it is inefficient to produce activated solders having different Ti densities on a case by case basis in order to change the Ti concentration, the concentration may be diluted by, for example, adding a great deal of pure Ag to the activated Ag solder when it is desired that the Ti concentration be remarkably lowered. The Ti density is relatively lowered if the amount of doping pure Ag is increased. Also, generally, the thermal conductivity of an Ag—Cu alloy is low in comparison with pure Ag and pure Cu when the Cu concentration in the alloy is in the range of 20 to 80% by volume fraction. Therefore, since Cu is included in Ag solder (for example, Ag:70% by weight—Cu:28% by weight—Ti:2% by weight) which is available on the market, the thermal conductivity of a composite material becomes the highest if pure Ag and Ag solder are blended so that the after-blending Cu concentration becomes 20% by volume fraction or less or 80% by volume fraction or more.

And, a composite material according to the invention may be produced as shown below. First, graphite powder of high purity, and Ag and/or Cu alloy powder containing at least one element belonging to 4A group such as Ti, Zr, Hf, etc., 5A group such as V, Nb, Ta, etc., and 6A group such as W, Cr, Mo, etc. are blended at a predetermined composition. Next, after the blended powder is molded, it is heated and sintered at a higher temperature than the melting point of the above-described alloy in a highly vacuum state whose pressure is 0.0133 Pa or less, or in a gas atmosphere such as He, Ar, or $H_2$.

By such a sintering process, the doped constituents such as the above-described Ti, etc., in the Ag and/or Cu alloy reacts with graphite when sintered, and a coating layer of carbide such as TiC is formed on the surface of graphite grains. Since the carbide, melted Ag and Cu have a remarkably high wettability, the boundary phase becomes wet at the same time when the carbide coating layer is generated, and firm adhesion is obtained between graphite powder, Ag and Cu.

It is possible to produce a composite material according to the invention by a method for infiltrating alloys at the same time when sintering, other than the above-described method. That is, after graphite powder is molded, the molded body thus obtained, Ag and/or Cu alloy lump or alloy powder including Ti, etc., or their molded bodies are brought into contact with each other, and they are heated at a higher temperature than the melting point of the above alloy in a high vacuum state whose pressure is 0.0133 Pa or less, or in an atmosphere including He, Ar or $H_2$, whereby a coating layer composed of a carbide such as TiC, etc., is formed on the surface of graphite powder, and at the same time, is made into a sintered body, and the above-described melted alloy can be infiltrated into the sintered body.

In either of the above-described methods, it is satisfactory that the heating temperature T(°C.) is higher than the melting point Tm(°C.) of the alloy. If the temperature is too high, the surface tension of the melted metal is lowered, and the metal may be likely to ooze out. Therefore, Tm<T<Tm+50° C. or so is preferable. Also, the heating time of 30 minutes is sufficient. If it is too long, the melted alloy may become likely to ooze out.

It is necessary that the heating is carried out in a highly vacuum state whose pressure is 0.0133 Pa ($1 \times 10^{-4}$ torr) or less or in a gas atmosphere of He, Ar or $H_2$. In the case of a vacuum atmosphere, if the degree of vacuum is low, a doped constituent such as, for example, Ti, etc., in the melted metal is oxidized or nitrified to lose its activity, and it will not react with graphite. In states other than a highly vacuum state, it is preferable that the heating is carried out while flowing He, Ar, $H_2$, etc. In addition, the gas atmosphere such as He, Ar, $H_2$, etc. may be pressurized. In particular, if the atmosphere of $H_2$ is used, since oxygen, $H_2O$ and OH group, etc., that are adsorbed onto the surface of graphite and alloy powder react with $H_2$ while the temperature is increasing, and is separated therefrom, the oxygen concentration in the metal is lowered to further increase the thermal conductivity.

The composite material thus produced according to the invention is a composite material composed of composite carbon grains having a coating layer formed on the surface thereof, and metal including silver and/or copper. A coating layer that is composed of a carbide of at least one metal selected from the elements belonging to 4A, 5A and 6A groups of the periodic table is formed on the surface of the composite carbon grains. The thermal conductivity and coefficient of thermal expansion of the composite material according to the invention may change in compliance with a change in the ratio of graphite grains to metals. Where the ratio of content of graphite grains is 50 through 95% by volume fraction in the total amount, it is possible to obtain a composite material whose relative density is 70% or more, whose thermal conductivity at least in a specified direction at room temperature is 220 W/m·K or more, and whose mean coefficient of thermal expansion is 5 through 15 ppm/°C. from the room temperature to 200° C. at least in a specified direction. In addition, if carbon fibers are used instead of graphite powder, the coefficient of thermal expansion is further decreased. Therefore, in this case, it may be acceptable that the ratio of content of carbon fibers is 30 through 95% by volume fraction.

If the blended powder of graphite powder and metal constituents is molded at a facial pressure of 300 MPa or more, the compaction or consolidation thereof may be accelerated while soft graphite powder is being deformed to be flat. In line therewith, the metal constituents may change, wherein a texture oriented as shown in FIG. 1 can be obtained after the sintering. FIG. 1 is a view showing a representative texture of an Ag—Cu based composite material according to the invention by magnifying the same 100 times by an optical microscope. In FIG. 1, a bright area indicates a metallic part whose main constituent is Ag, and a dark area indicates a non-metallic part whose main constituent is C. When the compaction of graphite powder is accelerated while being flattened, the c-axis of graphite crystal tends to be oriented in a direction parallel to the load direction of the molding pressure. However, the orientation property of the crystalline axis is not large in a usual single-axis molding press.

Thus, since the texture of the composite material has an orientation property and the graphite crystal itself may be oriented to some degree, remarkably high thermal conductivity is generated in a surfacewise inward direction of the composite material. However, the former is the major factor of causing such high thermal conductivity. For example, in graphite powder that is meso-phased pitch based graphite powder, thermally decomposed graphite powder or natural graphite powder, has a high purity and is well crystallized, the thermal conductivity in the c-axis direction is low to be only 30 W/m·K while the thermal conductivity in the a-axis direction reaches 1900 W/m·K. Where a composite material is produced by using such graphite powder, for example, in the case of an Ag—Cu based composite material, as the relative density becomes 100% in such composition in which the amount of graphite is 90% by volume fraction or so, the thermal conductivity becomes 100 W/m·K in the thickness direction while the thermal conductivity is 600 W/m·K in a surfacewise inward direction, wherein large anisotropy occurs. Although anisotropy occurs in the texture in graphite powder of the above-described type, high pressure exceeding 100 MPa will be required in order to generate anisotropy if the grain size of graphite powder is 10 μm or less, it is not practical. Also, if a granular SiC powder is used instead of a graphite powder, no anisotropy in the thermal conductivity will occur.

On the other hand, since the orientation property is lowered in the case where the molding pressure is 300 MPa or less, the anisotropy of thermal conductivity can be reduced. There is a case where slighter anisotropy is preferable in a certain structure of a heatsink. Also, where it is desirable to make the thermal conductivity isotropic, a cold or hot hydrostatic pressure molding process (isotropic pressure molding process) may be used without using a press molding process. Further, in order to look into the anisotropic degree, the peak strength of a plane perpendicular to the c-axis of graphite such as graphite (002) may be compared with the peak strengths of the others by X-ray diffraction.

In addition, the coefficient of thermal expansion of the composite material also has anisotropy, although it is not so much as in the case of the thermal conductivity. The coefficient of thermal expansion in the c-axis direction of graphite crystal is 30 ppm/°C. or so to be remarkably isotropic while the coefficient of thermal expansion in the a-axis direction of graphite crystal is almost zero. However, since the degree of orientation of the crystal axis is slight in usual one-axis press molding process, no remarkable difference is generated in the coefficient of thermal expansion between the in-face direction and thickness direction even if anisotropy appears in the texture as shown in FIG. 1. Due to the anisotropy in the coefficient of thermal expansion of such graphite crystal, the coefficient of thermal expansion in a surfacewise inward direction of the composite material becomes a figure that is smaller than that in the thickness direction, and the tendency will become remarkable in line with an increase in the ratio of content of graphite. But, no large anisotropy occurs in the composition having the ratio of content of graphite at 50% by volume fraction or so. Also, the smaller the graphite grain size becomes, the slighter the anisotropy in the texture of the composite material becomes. Therefore, where it is not desired that the anisotropy is generated, graphite having a small grain size may be used. The standard as to the grain size is 10 through 20 $\mu$m. In addition, if SiC is used instead of graphite, no anisotropy occurs in the coefficient of thermal expansion as in the case of the thermal conductivity.

In order to obtain a composite material having high thermal conductivity, the thickness of a coating layer composed of carbide such as the above-described TiC, which is formed on the surface of graphite, is preferably controlled to be in a range from 0.01 through 3 $\mu$m, further preferably in a range from 0.05 through 1 $\mu$m. The carbide itself has low thermal conductivity (for example, the thermal conductivity of TiC is 30 W/m·K or so), wherein as the thickness is increased, hindrance in the thermal conduction is increased in the carbide coating layer. To the contrary, if the carbide coating layer is too thin, an effect of the formation of carbide may be lost, allowing the wettability to be lowered, and hence the thermal conductivity decreases. And, titanium carbide (TiC) is most preferable among the carbides.

The thickness of the coating layer composed of carbide can be controlled by varying the grain size of graphite powder and the concentration of metal elements such as Ti, etc., in an Ag and/or Cu alloy. Also, since the specific surface area is increased in line with a decrease in the grain size of graphite, resultantly, the thickness of the carbide coating layer to be generated is reduced. Further, in order to increase the thickness of the coating layer such as TiC, etc., there is an available means such as increasing the concentration of the 4A group, 5A group and 6A group elements such as Ti, etc., which are contained in the metallic powder such as silver solder used together with a graphite powder.

For example, a voluntary infiltration method is available as a method for improving the relative density of a composite material. That is, by increasing the sintering temperature when producing a sintered body or lengthening the sintering time, melted metal is intentionally caused to ooze out from the sintered body to make the same into a porous body. For example, in the case of an Ag—Cu—Ti alloy, the Ag and Cu constituents ooze out, and are further volatilized to produce a porous body. The porous body is brought into contact with a metallic powder, powder-molded body or metallic lump, which is composed of Ag and/or Cu, and is heated at a higher temperature than the melting point of the metal in a vacuum state or in a non-oxidized atmosphere such as an inert gas. In this case, since a carbide coating layer such as TiC, etc., is already formed on the sintered body, the infiltration atmosphere may be a low vacuum state or an $N_2$ atmosphere.

By the infiltration method, metallic constituents such as Ag and Cu permeate the porous body, which results in a composite material composed of an infiltrated body having relative density of 95% or more and lower porosity than that in the case of the sintering method. As a result, the composite material made of an infiltrated body will be able to have thermal conductivity of 250 W/m·K or more at least in a specified direction at room temperature thereof.

Furthermore, an almost dense composite material can be produced by forging the sintered body in a hot state that has been produced by the sintering method and then preheated at a higher temperature than the melting point of an alloy used therein, in the atmosphere or in an inert gas atmosphere. The preheating is usually carried out in a usual furnace. For example, the preheating may be carried out in the atmosphere if a facility that can heat in a super-short time, such as a high frequency induction heating process, is used. It is satisfactory that the temperature of a metal mold is 500° C. or so, but it is necessary that the forging pressure is 600 MPa or more. If the forging pressure is less than 600 MPa, a relative density exceeding 99% cannot be obtained. In the composite material made of a forged substance thus obtained, the relative density is caused to become 99% or more, and the thermal conductivity is caused to become 270 W/m·K or more at least in a specified direction at room temperature.

The above-described description is an example in which the constituent to be composed with Ag and Cu is graphite. However, carbon fibers may be used instead of graphite powder. Pitch-based carbon fibers among carbon fibers have remarkably high conductivity and a high Young's modulus in the lengthwise direction of the fibers. Therefore, if the pitch-based carbon fibers are used, remarkably high thermal conductivity and low coefficient of thermal expansion can be obtained. Where the carbon fibers are used, regardless of the form: a sintered body, an infiltrated body or a forged body, the ratio of content thereof may be less than in the case of graphite grains, and is preferably in the range of 30 through 95% by volume fraction. That is, since carbon fibers have a high Young's modulus in the fiber direction, the coefficient of thermal expansion can be reduced with only a little bit of carbon fibers. Also, in the case of using carbon fibers, preferably the infiltration method is employed because it is difficult to achieve a uniform blending ratio of fibers and metallic powder in the case of the sintering method.

Further, a carbide powder such as SiC, etc., may be employed instead of graphite powder. In this case, preferably the ratio of content of the carbide powder in a composite material is all in a range from 15 through 85% by volume fraction in any case regardless of a sintered body, infiltrated body or forged body. Where the shape of SiC powder is spherical or close to the sphere, no anisotropy occurs in the thermal conductivity and coefficient of thermal expansion of a composite material that is obtained therefrom, differing from graphite powder. However, If hexagonal plate-like crystal, which is crystalline-idiomorphic, of SiC is used, there is a case where anisotropy occurs although not so much as in the case where graphite powder is used.

That is, in the hexagonal plate-like SiC grains, the in-face direction (a-axis direction) tends to be perpendicular to the pressurizing direction when molding. Since, in the SiC crystal, the thermal conductivity in the a-axis direction is higher than that in the c-axis direction, the thermal conductivity of the composite material produced by a press molding process becomes higher in the direction (in-face direction) perpendicular to the pressurizing direction. Also, where CIP is used, no anisotropy occurs as in the use of graphite powder. In addition, where carbide powder such as SiC, etc., is used, it is necessary that the molding pressure or hot-forging pressure is set to be higher than that of graphite powder in order to increase the relative density of the composite material.

In particular, where SiC powder is used as carbide powder, a preferable method to be employed in order to extremely increase the thermal conductivity of the composite material is to infiltrate a method alloy, which is mainly made of Ag and/or Cu, into a porous body made by firmly sintering the grains of SiC powder together. When the SiC grains are sintered, nitrogen atoms as well as impurity metal elements such as Fe and Al, which are contained in the SiC grains, are volatilized, whereby defects in crystal such as lamination defects existing in the SiC grains due to these impurity elements are reduced, which results in the increase of the thermal conductivity of SiC grains themselves. Further, since SiC grains are firmly sintered, the area of the boundary phase between SiC and metals is further reduced in comparison with a composite material having a texture in which SiC grains are dispersed, wherein the loss of thermal conductivity can be lowered at the boundary phase, and in addition thereto, Phonon conduction that transmits in only SiC crystal is applied to the thermal conduction mechanism of a composite material. This is a thermal conduction mechanism that cannot be obtained in grain-dispersed type composite materials, whereby the thermal conductivity of the composite material can be greatly improved. The grain size of SiC grains greatly influences the effect of the area of the above-described boundary phase. That is, the larger the grain size becomes, the further the area of the boundary phase is reduced, thereby improving the thermal conductivity.

Such an SiC porous body can be produced by pressurizing and sintering SiC powder in an inert gas atmosphere such as Ar gas, etc., or in a vacuum state at a higher temperature than 2000° C., using a hot press apparatus. Since nitrogen atoms are taken into an SiC crystal if the SiC powder is sintered in a nitrogen atmosphere, the thermal conductivity is not improved. SiC powder, which is available on the market, may be acceptable as the SiC powder to be used. However, most preferably an SiC powder should have impurities and crystal defects as little as possible. Such SiC powder may be produced by stoichiometrically blending Si powder having high purity and graphite powder having high purity, thermally treating the same and reacting them together. The produced SiC grain has a hexagonal plate-like shape, which is crystalline-automorphic, of SiC crystal.

In addition, although the cost is increased somewhat, powder that is obtained by crushing SiC monocrystal wafer having high purity and a low defect ratio, which is produced for semiconductor devices, may be used as SiC powder. If crushed powder of SiC monocrystal wafer is used, the thermal conductivity of a composite material is increased to be the highest, and it becomes possible to produce a composite material super high thermal conductivity exceeding 400 W/m·K that cannot be achieved by the use of SiC powder, which is available on the market, and hexagonal plate-like SiC powder.

Composite material A is obtained by bringing an alloy lump, alloy powder or its molded body, whose main constituent is silver and/or copper and which includes at least a type of metal selected from the group consisting of 4A group elements, 5A group elements, and 6A group elements of the periodic table, for example, an Ag—Cu based melted alloy including Ti, into contact with the SiC porous body thus produced, and heating the same to infiltrate into the SiC porous body. By such heating, simultaneously with the infiltrating of the above-described alloy, a coating layer of a carbide of at least one type of metal in the alloy, which is selected from the group consisting of 4A group elements, 5A group elements, and 6A group elements of the periodic table, such as TiC, is formed on the surface of the SiC grains that constitute the porous body.

In addition to the above-described method utilizing a voluntary infiltration process in a highly vacuum state, a method for pressurizing a helium, argon, or hydrogen gas atmosphere for infiltration is available as a method for infiltrating a melted metal into the SiC porous body. That is, where the pore size of the porous body is sufficiently large, voluntary infiltration is possible. But, if the pore size is small, it will become difficult for the voluntary infiltration to occur. Generally, pressure P necessary to infiltrate a melted metal into a porous body is expressed in terms of $P=-4\gamma\cos\theta/d$ (herein, $\gamma$ is the surface tension of a melted metal, contact angle $\theta$ is the contact angle between a melted metal and a porous material, and d is the minimum pore size of the porous body). The contact angle $\theta$ is an index of the wettability between a porous material and a melted metal, wherein the higher the wettability becomes, the smaller the contact angle $\theta$ becomes. Resultantly, the pressure P is reduced. In particular, as the contact angle $\theta$ becomes 90° C. or less, the pressure P becomes a minus figure, wherein basically the infiltration naturally occurs with no pressure applied. However, since the infiltration may be completed in a short time where the contact angle $\theta$ is as small as possible, it is important to improve the wettability. Further, the smaller the pore size d is, the larger the pressure P becomes. Therefore, for example, in the case of an SiC porous body that has been produced from an SiC powder of fine grains, natural infiltration hardly occurs, or it takes much time until the infiltration is completed. In such a case, by carrying out infiltration with pressure applied to a gas atmosphere, not depending on the natural infiltration, the infiltration can be completed in a short time to produce a dense composite material.

Further, after the composite material A is heated at a higher temperature than the infiltration temperature and metallic constituents are volatilized to make the same into a porous body again, pure Ag or pure copper or an Ag—Cu based alloy is brought into contact with the porous body and is infiltrated into the porous body by heating the same, whereby it is possible to obtain a composite material B of further higher thermal conductivity. The reason why the thermal conductivity of the composite material B becomes higher than that of the composite material A resides in that the thermal conductivity itself of the metallic constituents is further lowered than that of pure Ag or pure copper since Ti, etc., remains in the metallic constituents in the composite material A. To the contrary, in the composite material B, since the metallic constituents become pure Ag or pure Cu, the thermal conductivity of the metallic constituents is increased to be the highest, resulting in an increase in the thermal conductivity of the composite material. Also, the TiC coating layer formed on the surface of SiC grains is not removed by heating for volatilizing the metallic constituents, but the layer still remains in the composite material B.

The composite material according to the invention has high thermal conductivity, low coefficient of thermal expansion and an easy-to-machine property, and is remarkably effective as a heatsink material for semiconductors. In particular, the composite material is most suitable for semiconductor devices having a large amount of heat generation, such as semiconductor lasers and microwave elements.

Figure 2:
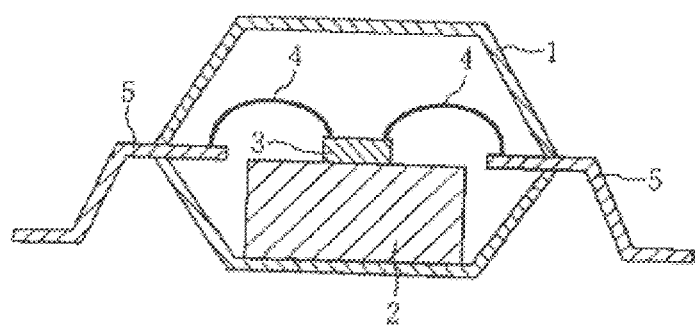
FIG. 2 is an exemplary sectional view of a detailed example of a package in which a heatsink composed of a composite material according to the invention is employed.

Referring to FIG. 2, a description is given of a detailed example, in which a heatsink material made of the composite material according to the invention is applied to a package. In the detailed example, a heatsink 2 composed of the composite material according to the invention is provided in a package 1, and a semiconductor element 3 is incorporated on the heatsink 2. A bonding wire 4 is connected to the semiconductor element 3, and the other end of the bonding wire 4 is connected to a lead frame 5.

Generally, in the package 1 of such a construction, since the semiconductor element 3 is smaller than the heatsink 2, it is more efficient to radiate heat in a surfacewise inward direction (horizontal direction) than in other directions in views of a heat radiating mechanism of the heatsink 2. Therefore, the composite material, in which the thermal conductivity in a surfacewise inward direction is high due to the orientation of graphite as in the composite material according to the invention, is best suitable as a heatsink material for such a use.

Example 1

As raw material powder, thermally decomposed graphite powder whose mean grain size is 400 μm, Ag powder (99.9%) whose mean grain size is 100 μm, and Ag solder powder whose mean grain size is 100 μm (Ag:70% by weight, Cu:28% by weight, and Ti:2% by weight) were prepared.

These types of powder were blended to be composed so that graphite powder becomes 50.3% by volume fraction, Ag powder becomes 24.6% by volume fraction, and Ag solder powder became 25.1% by volume fraction, and the powder was press-molded at various levels of pressure from 100 through 800 MPa, which are shown in Table I below. Respective molded bodies obtained in the above were heated, for one hour, at respective temperatures shown in Table I in the atmospheric pressure of $H_2$ to make the same into sintered bodies 35 mm diameter×12 mm thick. Also, the melting point of alloy composed as shown in Table I below is 846° C.

TABLE I

| Test sample | Amount of C (vol %) | Amount of Ag (vol %) | Sold amount of Ag (vol %) | Molding pressure (MPa) | Sintering temperature (° C.) |
|---|---|---|---|---|---|
| 1 | 50.3 | 24.6 | 25.1 | 100 | 850 |
| 2 | 50.3 | 24.6 | 25.1 | 200 | 850 |
| 3 | 50.3 | 24.6 | 25.1 | 300 | 850 |
| 4 | 50.3 | 24.6 | 25.1 | 400 | 850 |
| 5 | 50.3 | 24.6 | 25.1 | 600 | 850 |
| 6 | 50.3 | 24.6 | 25.1 | 800 | 850 |
| 7 | 50.3 | 24.6 | 25.1 | 800 | 840 |
| 8 | 50.3 | 24.6 | 25.1 | 800 | 850 |
| 9 | 50.3 | 24.6 | 25.1 | 800 | 886 |
| 10 | 50.3 | 24.6 | 25.1 | 800 | 900 |

The respective obtained sintered bodies were cut to a size of 10 mm diameter×2 mm thick. After the density was measured, the thermal conductivity was measured by the laser flash method. Also, the respective sintered bodies were cut to a size of 5 mm diameter×10 mm thick. After the density was measured, and the coefficient of thermal expansion was measured by a differential transformer thermal expansion coefficient measuring device. Also, the cutting of these test samples was carried out in two directions: a direction in which the thickness direction of the test samples coincide with the thickness direction of the sintered bodies; and a direction in which the thickness direction of the sintered bodies and the thickness direction of the test samples became perpendicular to each other. In addition, the amount of carbide of the respective test samples was measured, and at the same time, the boundary phase between graphite grains and a metal was observed by a transmission electron microscope, wherein the thickness of the carbide coating layer formed on the surface of graphite grains was measured.

Table II below shows the relative density of respective sintered body test samples, amount of carbide in the non-metallic portions, thickness of the carbide coating layer, and thermal conductivity and coefficient of thermal expansion in a surfacewise inward direction and thickness direction thereof, on the basis of the results of the above-described measurement. As has been made clear from the results, higher thermal conductivity was obtained in line with an increase in the molding pressure, and anisotropy of the thermal conductivity was increased. In addition, it is understood that higher thermal conductivity can be obtained by controlling the sintering temperature T so that T<Tm+50° C. is established with respect to the melting point Tm of metallic constituents.

TABLE II

| Test sample | Density (%) | Carbide (vol %) | Layer thickness (μm) | Thermal conductivity (W/mK) | | Coefficient of thermal expansion (ppm/° C.) | |
|---|---|---|---|---|---|---|---|
| | | | | In-plane direction | Thickness direction | In-plane direction | Thickness direction |
| 1 | 74.5 | 2.45 | 1.65 | 326 | 140 | 12.5 | 11.5 |
| 2 | 77.7 | 2.45 | 1.65 | 336 | 126 | 12.5 | 11.5 |
| 3 | 81.8 | 2.45 | 1.65 | 356 | 119 | 12.5 | 11.5 |
| 4 | 82.6 | 2.45 | 1.65 | 364 | 112 | 12.5 | 11.5 |
| 5 | 84.2 | 2.45 | 1.65 | 371 | 106 | 12.5 | 11.5 |
| 6 | 85.8 | 2.45 | 1.65 | 379 | 105 | 12.4 | 11.4 |
| 7 | 85.8 | 2.45 | 1.65 | 126 | 46 | 13.5 | 12.5 |
| 8 | 85.8 | 2.45 | 1.65 | 379 | 105 | 12.4 | 11.4 |
| 9 | 85.8 | 2.45 | 1.65 | 366 | 112 | 12.4 | 11.4 |
| 10 | 85.8 | 2.45 | 1.65 | 340 | 95 | 12.4 | 11.4 |

Example 2

As raw material powder, thermally decomposed graphite powder whose mean grain size is 400 μm, Ag powder (99.9%) whose mean grain size is 100 μm, and Ag solder powder whose mean grain size is 100 μm (Ag:98% by weight and Ti:2% by weight) were prepared. These types of powder were blended so as to be composed as shown in Table III below and were press-molded at a pressure level of 800 MPa. The respective obtained molded bodies were heated, for one hour, in the atmospheric pressure of Ar at respective temperatures shown in Table I to make the same into sintered bodies 35 mm diameter×12 mm thick. Also, the melting point of alloys having respective compositions shown in Table III below is as shown in Table III.

TABLE III

| Test sample | Amount of C (vol %) | Amount of Ag (vol %) | Sold amount of Ag (vol %) | Alloy melting point (° C.) | Sintering temperature (° C.) |
|---|---|---|---|---|---|
| 11 | 49.4 | 0.6 | 50.0 | 781 | 801 |
| 12 | 49.6 | 5.8 | 44.6 | 791 | 811 |
| 13 | 50.3 | 24.6 | 25.1 | 799 | 819 |
| 14 | 50.6 | 34.2 | 15.2 | 822 | 842 |
| 15 | 50.9 | 41.5 | 7.6 | 846 | 866 |
| 16 | 51.1 | 47.9 | 1.0 | 878 | 898 |
| 17 | 51.1 | 48.2 | 0.7 | 921 | 941 |
| 18 | 51.2 | 48.7 | 0.1 | 957 | 977 |
| 19* | 51.2 | 48.8 | 0.0 | 959 | 979 |

(Note: Test samples marked with an asterisk (*) are comparison controls (hereinafter, the asterisk indicates the same meaning)

The test samples of the respective obtained sintered bodies were evaluated as in the Example 1. Table IV below shows the relative density of the test samples of respective sintered bodies, amount of carbide in the non-metallic portions, thickness of the carbide coating layer, and thermal conductivity and coefficient of thermal expansion in a surfacewise inward direction and thickness direction thereof, on the basis of the results of the above-described evaluation. As has been made clear from the results, higher thermal conductivity was obtained where the thickness of the coating layer of carbide TiC is in a range from 0.01 through 3 μm, in particular in a range from 0.05 through 1 μm.

TABLE IV

| Test sample | Density (%) | Carbide (vol %) | Layer thickness (μm) | Thermal conductivity (W/mK) | | Coefficient of thermal expansion (ppm/° C.) | |
|---|---|---|---|---|---|---|---|
| | | | | In-plane direction | Thickness direction | In-plane direction | Thickness direction |
| 11 | 86.9 | 4.90 | 3.32 | 210 | 55 | 11.1 | 10.1 |
| 12 | 86.7 | 4.37 | 2.95 | 225 | 60 | 11.0 | 10.0 |
| 13 | 85.8 | 2.45 | 1.65 | 256 | 66 | 10.9 | 9.9 |
| 14 | 85.4 | 1.48 | 0.99 | 333 | 131 | 10.8 | 9.8 |
| 15 | 85.1 | 0.74 | 0.50 | 369 | 130 | 10.8 | 9.8 |
| 16 | 84.8 | 0.09 | 0.06 | 354 | 130 | 10.7 | 9.7 |
| 17 | 84.8 | 0.06 | 0.04 | 311 | 130 | 10.7 | 9.7 |
| 18 | 84.8 | 0.01 | 0.01 | 223 | 129 | 10.7 | 9.7 |
| 19* | 84.8 | 0.01 | 0.00 | 176 | 42 | 10.7 | 9.7 |

Example 3

Respective raw material powders that are the same as those in the Example 2, that is, thermally decomposed graphite powder whose mean grain size of 400 μm, Ag powder (99.9%) whose mean grain size is 100 μm, and Ag solder powder whose mean grain size is 100 μm (Ag:98% by weight and Ti:2% by weight) were prepared. These types of powder were blended so as to be composed as shown in Table V below and were press-molded at a pressure level of 800 MPa. The respective obtained molded bodies were heated, for one hour, in the atmospheric pressure of He at respective temperatures shown in Table V to make the same into sintered bodies 35 mm diameter×12 mm thick. Also, the melting point of alloys having respective compositions shown in Table V below is as shown in Table V.

TABLE V

| Test sample | Amount of C (vol %) | Amount of Ag (vol %) | Sold amount of Ag (vol %) | Alloy melting point (° C.) | Sintering temperature (° C.) |
|---|---|---|---|---|---|
| 20 | 50.5 | 32.4 | 17.1 | 828 | 848 |
| 21 | 60.6 | 21.9 | 17.5 | 823 | 843 |
| 22 | 75.1 | 5.9 | 19.0 | 798 | 818 |
| 23 | 81.7 | 1.7 | 16.6 | 788 | 808 |
| 24 | 86.9 | 0.0 | 13.1 | 780 | 800 |
| 25 | 89.2 | 0.0 | 10.8 | 780 | 800 |
| 26 | 90.4 | 0.0 | 9.6 | 780 | 800 |

The test samples of respective obtained sintered bodies were evaluated as in the Example 1. Table VI below shows the relative density of the test samples of the respective sintered bodies, amount of carbide in the non-metallic portions, thickness of the carbide coating layer, and thermal conductivity and coefficient of thermal expansion in a surfacewise inward direction and thickness direction thereof, on the basis of the results of the above-described evaluation. As has been made clear from the results in Table VI, the more the amount of carbon is increased, the thinner the thickness of the carbide coating layer becomes. The coefficient of thermal expansion decreases while the thermal conductivity increases.

TABLE VI

| Test sample | Density (%) | Carbide (vol %) | Layer thickness (μm) | Thermal conductivity (W/mK) | | Coefficient of thermal expansion (ppm/° C.) | |
|---|---|---|---|---|---|---|---|
| | | | | In-plane direction | Thickness direction | In-plane direction | Thickness direction |
| 20 | 85.5 | 1.66 | 1.11 | 351 | 131 | 10.9 | 10.0 |
| 21 | 85.8 | 1.42 | 0.95 | 363 | 122 | 9.9 | 12.0 |
| 22 | 84.3 | 1.25 | 0.84 | 382 | 110 | 7.5 | 13.9 |
| 23 | 88.5 | 1.00 | 0.67 | 391 | 100 | 6.8 | 14.4 |
| 24 | 87.4 | 0.74 | 0.50 | 399 | 95 | 6.0 | 15.0 |
| 25 | 85.7 | 0.60 | 0.40 | 403 | 90 | 5.6 | 15.4 |
| 26 | 85.1 | 0.52 | 0.35 | 356 | 82 | 5.5 | 15.5 |

Example 4

Respective raw material powders that are the same as those in the Example 2 were prepared, and were blended to be composed so that graphite powder becomes 50.5% by volume fraction, Ag powder becomes 32.4% by volume fraction, and Ag solder powder becomes 17.1% by volume fraction. And, they were press-molded at a pressure level of 800 MPa. The respective obtained molded bodies were heated, for one hour, at 848° C. in the atmosphere and at a pressure level, which are shown in Table VII below, in order to make them into sintered bodies of 35 mm diameter×12 mm thick. Further, the melting point of the alloy of the above-described composition is 828° C. Also, for comparison, test sample 20 in the above-described Example 3 was also shown in Table VII.

TABLE VII

| Test sample | Amount of C (vol %) | Amount of Ag (vol %) | Sold amount of Ag (vol %) | Sintering atmosphere and pressure | |
|---|---|---|---|---|---|
| 20 | 50.5 | 32.4 | 17.1 | He | 1 atmospheric pressure |
| 27* | 50.5 | 32.4 | 17.1 | Vacuum | 0.133 Pa |
| 28 | 50.5 | 32.4 | 17.1 | Vacuum | 0.0133 Pa |
| 29* | 50.5 | 32.4 | 17.1 | $N_2$ | 1 atmospheric pressure |

The test samples of the respective sintered bodies thus obtained were evaluated as in the Example 1. Table VIII below shows the relative density of respective sintered bodies, amount of carbide in the non-metallic portions, thickness of the carbide coating layer, and thermal conductivity and coefficient of thermal expansion in a surfacewise inward direction and thickness direction thereof, on the basis of the results of the above-described evaluation. As has been made clear from the results in Table VIII below, the thermal conductivity was remarkably reduced in the case where the materials were sintered in a vacuum state whose pressure is 0.133 Pa and in the atmosphere of nitrogen gas.

TABLE VIII

| Test sample | Density (%) | Carbide (vol %) | Layer thickness (μm) | Thermal conductivity (W/mK) | | Coefficient of thermal expansion (ppm/° C.) | |
|---|---|---|---|---|---|---|---|
| | | | | In-plane direction | Thickness direction | In-plane direction | Thickness direction |
| 20 | 85.5 | 1.66 | 1.11 | 351 | 131 | 10.9 | 10.0 |
| 27* | 56.4 | 1.66 | 1.11 | 211 | 40 | 10.9 | 9.9 |
| 28 | 56.4 | 1.66 | 1.11 | 351 | 130 | 10.9 | 9.9 |
| 29* | 56.4 | 1.66 | 1.11 | 216 | 50 | 10.9 | 9.9 |

Example 5

Using the test samples 20 through 22 of the sintered bodies produced in the Example 3, respective forged bodies were produced. That is, using a high frequency induction heating apparatus, the respective sintered bodies were heated for 20 seconds in the atmosphere to reach a temperature of 850° C. They were picked out at the moment when the temperature reached 850° C., and were put in a metal mold that have been preheated to 500° C., wherein they were forged at a pressure of 900 MPa in a hot state.

The respective test samples of forged bodies thus obtained were evaluated as in the Example 1. Table IX below shows the result of the evaluation. The respective forged body test samples 20-1, 21-1, and 22-1 are those obtained by forging the respective sintered body test samples 20, 21 and 22. As can be seen from the results shown in Table IX, the sintered bodies were made dense to almost 100% by forging, whereby the thermal conductivity of the forged bodies was greatly improved in comparison with that of the sintered bodies.

sintered bodies 35 mm diameter×12 mm thick. Also, the melting point of alloy composed as shown in Table X below is 1083° C.

Using a high frequency induction heating apparatus, the respective obtained sintered bodies were heated, for 20 seconds, in the atmosphere to reach a temperature of 1000° C. They were picked out at the moment when the temperature reached 1000° C., and were put in a metal mold which had been preheated to 500° C., wherein they were forged at a pressure level 900 MPa in a hot state.

TABLE X

| Test sample | Amount of C (vol %) | Amount of Cu (vol %) | Sold amount of Cu (vol %) | Sintering temperature (° C.) | Forging temperature (° C.) | Forging pressure (MPa) |
|---|---|---|---|---|---|---|
| 30 | 50.8 | 39.0 | 10.2 | 1093 | 1100 | 900 |
| 31 | 60.9 | 27.0 | 12.1 | 1093 | 1100 | 900 |
| 32 | 75.3 | 9.9 | 14.8 | 1093 | 1100 | 900 |
| 33 | 84.5 | 1.6 | 13.9 | 1093 | 1100 | 900 |
| 34 | 89.2 | 0.0 | 10.8 | 1093 | 1100 | 900 |

TABLE IX

| Test sample | Density (%) | Carbide (vol %) | Layer thickness (μm) | Thermal conductivity (W/mK) | | Coefficient of thermal expansion (ppm/° C.) | |
|---|---|---|---|---|---|---|---|
| | | | | In-plane direction | Thickness direction | In-plane direction | Thickness direction |
| 20-1 | 99.6 | 1.66 | 1.11 | 501 | 187 | 10.9 | 10.2 |
| 21-1 | 99.4 | 1.42 | 0.95 | 519 | 151 | 8.9 | 12.0 |
| 22-1 | 99.8 | 1.25 | 0.84 | 545 | 103 | 5.9 | 13.7 |

Example 6

As raw material powder, thermally decomposed graphite powder whose mean grain size is 200 μm, Cu powder (99.9%) whose mean grain size is 100 μm, and CU solder powder whose mean grain size is 100 μm (Cu:98% by weight, and Ti:2% by weight) were prepared. These types of powder were blended at respective compositions shown in Table X below. The powder was press-molded at a pressure level of 800 MPa. Respective molded bodies obtained in the above were heated, for one hour, at a temperature of 1093° C. in the atmospheric pressure of $H_2$ to make the same into Respective test samples of the forged bodies thus obtained were evaluated as in the Example 1. Table XI below shows the relative density of the respective sintered body test samples, amount of carbide in non-metallic portions, thickness of the carbide coating layer, thermal conductivity and coefficient of thermal expansion in a surfacewise inward direction and thickness direction as the results of the evaluation. As has been made clear from Table XI below, the Cu—C based composite material was made dense to almost 100% by forging, wherein excellent thermal conductivity was obtained.

TABLE XI

| Test sample | Density (%) | Carbide (vol %) | Layer thickness (μm) | Thermal conductivity (W/mK) | | Coefficient of thermal expansion (ppm/° C.) | |
|---|---|---|---|---|---|---|---|
| | | | | In-plane direction | Thickness direction | In-plane direction | Thickness direction |
| 30 | 99.8 | 0.99 | 0.33 | 489 | 176 | 11.2 | 11.0 |
| 31 | 100.0 | 0.98 | 0.33 | 509 | 142 | 10.3 | 12.0 |
| 32 | 100.0 | 0.97 | 0.33 | 539 | 98 | 7.4 | 14.0 |
| 33 | 100.0 | 0.81 | 0.27 | 560 | 71 | 6.0 | 15.0 |
| 34 | 100.0 | 0.60 | 0.20 | 572 | 58 | 5.4 | 15.3 |

Example 7

As raw material powder, SiC powder (6H type) whose mean grain size is 200 μm, Ag powder (99.9%) whose mean grain size is 100 μm, and Ag solder powder whose mean grain size is 100 μm (Cu:93% by weight, Cu:3% by weight, and M:2% by weight; M=Ti, W, Cr, Hf, V, Nb, Ta and Mo) were prepared.

These types of powder were blended at respective compositions shown in Table XII below. The powder was press-molded at a pressure level of 800 MPa. Respective molded bodies obtained in the above were heated, for one hour, at a temperature of 950° C. in the atmospheric pressure of $H_2$ to make the same into sintered bodies 35 mm diameter×12 mm thick. Also, the melting point of the respective alloys composed as shown above is about 940° C. Using a high frequency induction heating apparatus, the respective obtained sintered bodies were heated, for 20 seconds, in the atmosphere to reach a temperature of 960° C. They were picked out at the moment when the temperature reaches 960° C., and were put in a metal mold that had been preheated to 500° C., wherein they were forged at a pressure level 900 MPa in a hot state.

TABLE XII

| Test sample | Element M | Amount of SiC (vol %) | Amount of Ag (vol %) | Sold amount of Ag (vol %) |
| --- | --- | --- | --- | --- |
| 35 | Ti | 17.3 | 79.0 | 3.7 |
| 36 | Ti | 51.7 | 34.7 | 13.6 |
| 37 | Ti | 67.8 | 15.5 | 16.7 |
| 38 | Ti | 75.6 | 5.5 | 18.9 |
| 39 | Ti | 82.1 | 0.0 | 17.9 |
| 40 | W | 67.8 | 15.5 | 16.7 |
| 41 | Cr | 67.8 | 15.5 | 16.7 |
| 42 | Hf | 67.8 | 15.5 | 16.7 |
| 43 | V | 67.8 | 15.5 | 16.7 |
| 44 | Nb | 67.8 | 15.5 | 16.7 |
| 45 | Ta | 67.8 | 15.5 | 16.7 |
| 46 | Mo | 67.8 | 15.5 | 16.7 |

Respective test samples of the forged bodies thus obtained were evaluated as in the Example 1. Table XIII below shows the relative density of the respective sintered body test samples, amount of carbide in non-metallic portions, thickness of the carbide coating layer, thermal conductivity and coefficient of thermal expansion in a surfacewise inward direction and thickness direction as the results of the evaluation. If SiC powder is used as raw material powder instead of graphite powder, no anisotropy occurs in the thermal conductivity and coefficient of thermal expansion.

TABLE XIII

| Test sample | Density (%) | Carbide (vol %) | Layer thickness (μm) | Thermal conductivity (W/mK) | | Coefficient of thermal expansion (ppm/° C.) | |
| --- | --- | --- | --- | --- | --- | --- | --- |
| | | | | In-plane direction | Thickness direction | In-plane direction | Thickness direction |
| 35 | 79.3 | 2.17 | 0.73 | 392 | 392 | 12.5 | 12.5 |
| 36 | 98.5 | 2.60 | 0.88 | 358 | 358 | 7.3 | 7.3 |
| 37 | 98.8 | 2.44 | 0.82 | 342 | 342 | 6.1 | 6.1 |
| 38 | 99.4 | 2.47 | 0.83 | 335 | 335 | 5.6 | 5.6 |
| 39 | 99.7 | 2.17 | 0.73 | 330 | 330 | 5.3 | 5.3 |
| 40 | 100.0 | 2.44 | 0.82 | 330 | 330 | 6.1 | 6.1 |
| 41 | 100.0 | 2.44 | 0.82 | 326 | 326 | 6.1 | 6.1 |
| 42 | 100.0 | 2.44 | 0.82 | 335 | 335 | 6.1 | 6.1 |
| 43 | 100.0 | 2.44 | 0.82 | 315 | 315 | 6.1 | 6.1 |
| 44 | 100.0 | 2.44 | 0.82 | 320 | 320 | 6.1 | 6.1 |
| 45 | 100.0 | 2.44 | 0.82 | 320 | 320 | 6.1 | 6.1 |
| 46 | 100.0 | 2.44 | 0.82 | 319 | 319 | 6.1 | 6.1 |

Example 8

As raw material powder, SiC powder (6H type) whose mean grain size is 200 μm, Ag powder (99.9%) whose mean grain size is 100 μm, and Ag solder powder whose mean grain size is 100 μm (Ag:98% by weight, and Ti:2% by weight) were prepared.

The SiC powder and Ag solder powder were blended at respective compositions shown in Table XIV below, and were press-molded at a pressure level of 800 MPa. Respective molded bodies obtained in the above were heated, for three hour, at a temperature of 970° C. in a vacuum state whose pressure is 0.00133 Pa, wherein a part of metal is eluted, at the same time when sintering, to make the same into porous bodies 35 mm diameter×12 mm thick. Also, the melting point of the Ag solder composed as above was 950° C. Next, the above-described Ag powder molded body of the same shape was brought into contact with the respective obtained porous bodies and installed thereon, and was heated, for 30 minutes, at a temperature of 970° C. in an $H_2$ atmosphere, thereby infiltrating Ag into the porous bodies. Also, the amount of infiltration of Ag that is shown in Table XIV indicates the amount of Ag infiltrated into the infiltrated bodies.

TABLE XIV

| Test sample | Amount of SiC (vol %) | Sold amount of Ag (vol %) | Sintering temperature (° C.) | Infiltration temperature (° C.) | Infiltrating amount of Ag (vol %) |
| --- | --- | --- | --- | --- | --- |
| 47 | 64.2 | 35.8 | 970 | 970 | 32 |
| 48 | 67.0 | 33.0 | 970 | 970 | 29 |
| 49 | 63.2 | 36.8 | 970 | 970 | 34 |

Respective test samples of the infiltrated bodies thus obtained were evaluated as in the Example 1. Table XV below shows the relative density of the respective sintered body test samples, amount of carbide in non-metallic portions, thickness of the carbide coating layer, thermal conductivity and coefficient of thermal expansion in a surfacewise inward direction and thickness direction as the results of the evaluation.

TABLE XV

| Test sample | Density (%) | Carbide (vol %) | Layer thickness (μm) | Thermal conductivity (W/mK) | | Coefficient of thermal expansion (ppm/° C.) | |
|---|---|---|---|---|---|---|---|
| | | | | In-plane direction | Thickness direction | In-plane direction | Thickness direction |
| 47 | 99.8 | 2.77 | 0.93 | 348 | 348 | 6.3 | 6.3 |
| 48 | 99.8 | 2.44 | 0.82 | 346 | 346 | 6.1 | 6.1 |
| 49 | 99.9 | 2.89 | 0.97 | 349 | 349 | 6.4 | 6.4 |

Example 9

A metal bonding layer of Au—Sn was formed in the thickness of 3 μm by using a vacuum deposition method, so as to enable soldering, on the surface of a test sample 22-1 composed of an Ag—C based composite forged material produced in Example 5. An Si-made semiconductor laser element and a GaAs-made semiconductor laser element, each having dimensions of 0.3×0.3×0.1 mm, were respectively bonded, using an Au—Sn alloy solder material, onto each heatsink thus produced.

Saturated light outputs of the respective obtained laser elements were measured and compared with each other to evaluate the performance thereof. The results are shown in Table XVI below. Also, a semiconductor laser element was bonded, as in the above, to a conventional Al—SiC based heatsink as well as to a diamond-based heatsink, and a comparative evaluation was made. The results are shown in Table XVI below.

TABLE XVI

| Semiconductor element | | Heatsink | | | | |
|---|---|---|---|---|---|---|
| Material | Coefficient of thermal expansion (ppm/° C.) | Material | Coefficient of thermal expansion (ppm/° C.) | Thermal conductivity (W/mK) | Saturated light output | Crack occurrence |
| Si | 4.2 | Al—SiC | 7.2 | 300 | 60 | Crack free |
| Si | 4.2 | Diamond | 2.3 | 1000 | 95 | Crack free |
| Si | 4.2 | Ag—C | 5.9 | 545 | 100 | Crack free |
| GaAs | 5.9 | Al—SiC | 7.2 | 300 | 65 | Crack free |
| GaAs | 5.9 | Diamond | 2.3 | 1000 | Impossible to measure | GaAs cracked |
| GaAs | 5.9 | Ag—C | 5.9 | 545 | 100 | Crack free |

(Note) The saturated light output indicates the relative figure where the saturated light output of Ag—C based material is assumed to be 100.

A high saturated light output was obtained in the heatsink composed of an Ag—C composite material according to the invention. It is considered that the saturated light output is increased since heat is easily discharged due to high thermal conductivity of the composite material according to the invention, the coefficient of thermal expansion is close to that of semiconductor elements and the composite material is a carbon matrix having a small Young's modulus, a strain resulting from thermal stress is hardly generated on the semiconductor elements, the laser generation efficient is high, and the thermal conductivity of the heatsink is high.

Example 10

A metal bonding layer of Au—Sn was formed in the thickness of 3 μm by using a vacuum deposition method, so as to enable soldering, on the surface of respective test samples 30 through 34 composed of a Cu—C based composite forged material produced in Example 6. Using an Au—Sn alloy solder material at a temperature of 300° C., GaAs-made semiconductor laser chip of 0.3×0.3×0.1 mm was bonded to each heatsink thus produced.

The respective obtained lasers were continuously oscillated at an output of 150 mW, and fluctuations of temperature of the semiconductor laser were measured. Also, a semiconductor laser chip was bonded, as in the above, to a conventional Al—SiC based heatsink as well as to a diamond-based heatsink, and a comparative evaluation was carried out. The results thus obtained are shown in Table XVII below.

TABLE XVII

| Semiconductor element | | Heatsink | | | | |
|---|---|---|---|---|---|---|
| Material | Coefficient of thermal expansion (ppm/° C.) | Material | Coefficient of thermal expansion (ppm/° C.) | Thermal conductivity (W/mK) | Oscillation state | Crack occurrence |
| GaAs | 5.9 | Al—SiC | 7.2 | 300 | Unstable | Crack free |
| GaAs | 5.9 | Diamond | 2.3 | 1000 | Unstable | GaAs cracked |
| GaAs | 5.9 | Cu—C | 11.2 | 489 | Stable | Crack free |
| GaAs | 5.9 | Cu—C | 10.3 | 509 | Stable | Crack free |
| GaAs | 5.9 | Cu—C | 7.4 | 539 | Stable | Crack free |
| GaAs | 5.9 | Cu—C | 6.0 | 560 | Stable | Crack free |
| GaAs | 5.9 | Cu—C | 5.4 | 572 | Stable | Crack free |

By using a Cu—C based heatsink according to the invention, a stabilized state of laser oscillation was obtained. It is considered that the stabilized state of laser oscillation is obtained since heat is easily discharged due to high thermal conductivity of the Cu—C composite material according to the invention, the coefficient of thermal expansion is close to that of semiconductor elements and the composite material is a carbon matrix having a small Young's modulus, and a strain resulting from thermal stress is hardly generated on the semiconductor elements.

Example 11

As raw material powder, natural graphite powder whose mean grain size is 200 μm, SiC (6H type) powder whose mean grain size is 200 μm, Ag powder (99.9%) whose mean grain size is 50 μm, and Ag solder powder whose mean grain size is 65 μm (Ag:98% by weight and Ti:2% by weight) were prepared. These types of powder were blended so as to be composed as shown in Table XVIII and were press-molded at a pressure level of 800 MPa. Respective molded bodies obtained in the above were heated, for one hour, at a temperature of 960° C. in the atmospheric pressure of $H_2$ to make the same into sintered bodies 35 mm diameter×12 mm thick. Also, the melting point of alloys composed as shown in Table XVIII below is all about 950° C. Using a high frequency induction heating apparatus, the respective obtained sintered bodies were heated for 20 seconds in the atmosphere to reach a temperature of 970° C. They were picked out at the moment when the temperature reaches 970° C., and were put in a metal mold that had been preheated to 500° C., wherein they were forged at a pressure level 850 MPa in a hot state.

TABLE XVIII

| Test sample | Amount of C (vol %) | Amount of SiC (vol %) | Amount of Ag (vol %) | Sold amount of Ag (vol %) |
|---|---|---|---|---|
| 50 | 56.1 | 0.0 | 27.4 | 16.5 |
| 51 | 27.8 | 27.8 | 28.9 | 15.5 |
| 52 | 22.4 | 33.6 | 29.0 | 15.0 |
| 53 | 16.9 | 39.5 | 29.1 | 14.5 |
| 54 | 71.7 | 0.0 | 24.2 | 4.1 |
| 55 | 35.9 | 35.9 | 23.2 | 5.0 |
| 56 | 28.4 | 42.7 | 23.8 | 5.1 |
| 57 | 21.1 | 49.3 | 24.4 | 5.2 |

The respective test samples of forged bodies thus obtained were evaluated as in Example 1. Table XIX below indicates, as the results of the evaluation, the amount of carbide in the non-metallic portion, the thickness of the carbide coating layer, the thermal conductivity and the coefficients of thermal expansion in a surfacewise inward direction and thickness direction. Also, the relative density of the forged bodies of the respective test samples was all 100%. As can be seen in Table XIX below, blending SiC enabled the composite materials to have a lower coefficient of thermal expansion than in the case of using only carbon. Also, the strength of the composite material can be increased by blending SiC, and the reliability can be increased where the composite material is used as a heatsink material.

TABLE XIX

| Test sample | Carbide (vol %) | Layer thickness (μm) | Thermal conductivity (W/mK) | | Coefficient of thermal expansion (ppm/° C.) | | Bending strength (MPa) |
|---|---|---|---|---|---|---|---|
| | | | In-plane direction | Thickness direction | In-plane direction | Thickness direction | |
| 50 | 2.07 | 0.70 | 433 | 160 | 8.5 | 8.7 | 165 |
| 51 | 1.63 | 0.55 | 372 | 237 | 7.6 | 7.7 | 188 |
| 52 | 1.50 | 0.50 | 360 | 251 | 7.4 | 7.4 | 202 |
| 53 | 1.39 | 0.46 | 347 | 264 | 7.1 | 7.1 | 223 |
| 54 | 0.42 | 0.14 | 461 | 118 | 5.5 | 5.6 | 103 |
| 55 | 0.41 | 0.14 | 380 | 208 | 6.0 | 6.1 | 132 |
| 56 | 0.41 | 0.14 | 363 | 227 | 6.0 | 6.0 | 155 |
| 57 | 0.41 | 0.14 | 408 | 289 | 5.9 | 5.9 | 185 |

Example 12

As raw material powder, natural graphite powder whose mean grain size is 300 μm, SiC powder(6H type) whose mean grain size is 300 μm, Cu powder (99.9%) whose mean grain size is 100 μm, and Cu solder powder whose mean grain size is 100 μm (Cu:92% by weight, Ag:5% by weight and Ti:3% by weight) were prepared.

These types of powder were blended so as to be composed as shown in Table XX below and were press-molded at a pressure level of 800 MPa. Respective molded bodies obtained in the above were heated, for one hour, at a temperature of 1040° C. in the atmospheric pressure of $H_2$ to make the same into sintered bodies 35 mm diameter×12 mm thick. Also, the melting point of alloys composed as shown in Table XX below is all about 1020° C. Using a high frequency induction heating apparatus, the respective obtained sintered bodies were heated for 20 seconds in the atmosphere to reach a temperature of 1050° C. They were picked out at the moment when the temperature reached 1050° C., and were put in a metal mold that had been preheated to 500° C., wherein they were forged at a pressure level 850 MPa in a hot state.

TABLE XX

| Test sample | Amount Of C (vol %) | Amount of SiC (vol %) | Amount of Cu (vol %) | Sold amount of Cu (vol %) |
|---|---|---|---|---|
| 58 | 60.4 | 0.0 | 28.5 | 11.1 |
| 59 | 29.6 | 29.6 | 27.6 | 13.2 |
| 60 | 23.9 | 35.8 | 27.8 | 12.5 |
| 61 | 18.0 | 42.0 | 27.9 | 12.1 |

Respective test samples of forged bodies thus obtained were evaluated as in the Example 1. Table XXI below indicates the amount of carbide in the non-metallic portion, thickness of the carbide coating layer, thermal conductivity and coefficient of thermal expansion in a surfacewise inward direction and thickness direction as the result of the evaluation. The relative density of the forged bodies of the respective test samples was 100% in all. As has been made clear in Table XXI below, it became possible to further lower the coefficient of thermal expansion of the composite material by blending SiC with the respective test samples than by using only carbon. Also, the strength of the composite material can be increased by blending SiC, and the reliability can be increased where it is used as a heatsink material.

TABLE XXI

| Test sample | Carbide (vol %) | Layer thickness (μm) | Thermal conductivity (W/mK) | | Coefficient of thermal expansion (ppm/° C.) | | Bending strength (MPa) |
|---|---|---|---|---|---|---|---|
| | | | In-plane direction | Thickness direction | In-plane direction | Thickness direction | |
| 58 | 1.95 | 0.98 | 503 | 140 | 7.6 | 8.5 | 150 |
| 59 | 1.92 | 0.97 | 407 | 204 | 7.2 | 7.3 | 170 |
| 60 | 1.77 | 0.89 | 388 | 215 | 7.0 | 7.0 | 195 |
| 61 | 1.63 | 0.82 | 367 | 226 | 6.8 | 6.8 | 220 |

Example 13

Pitch-based carbon fibers (two-dimensional satin weave, fiber-based 15 μm, and thermal conductivity in the fibrous axis direction is 1400 W/m·K) were prepared as carbon materials, and Ag solder powder (Ag:90% by weight, Cu:4% by weight, Ti:6% by weight) whose mean grain size is 100 μm was prepared as a metallic material.

The above-described silver solder powder and carbon fibers are laminated alternately so as to be composed as shown in Table XXII below, and were press-molded at a pressure level of 500 MPa. The respective molded bodies were heated, for one hour, at a temperature of 880° C. in the atmospheric pressure of $H_2$ to make the same into a sintered body 35 mm diameter×12 mm thick. Also, the melting point of the above-described silver solder is 870° C.

TABLE XXII

| Test sample | Amount of C (vol %) | Sold amount of Ag (vol %) |
|---|---|---|
| 62 | 59.7 | 40.3 |
| 63 | 52.6 | 47.4 |
| 64 | 43.9 | 56.1 |
| 65 | 33.0 | 67.0 |

Respective test samples of forged bodies thus obtained were evaluated as in the Example 1. Table XXIII below indicates the relative density, amount of carbide in the non-metallic portion, thickness of the carbide coating layer, thermal conductivity and coefficient of thermal expansion in a surfacewise inward direction and thickness direction as the result of the evaluation. As has been made clear in Table XXIII below, it became possible to obtain higher thermal conductivity by using carbon fibers than in the case of using graphite powder.

Example 14

As raw material powder, SiC powder(6H type) whose mean grain size is 200 through 500 μm, Ag powder whose mean grain size is 100 μm, Cu powder (99.9%) whose mean grain size is 100 μm, and Ag solder powder whose mean grain size is 100 μm (Ag:98% by weight, and Ti:2% by weight) were prepared. The above-described SiC powder was inputted in a carbon mold die 20 mm diameter, and was sintered, for two hours, at a pressure level of 50 MPa at a temperature of 2300° C. in an Ar gas atmosphere whose pressure is 0.1 MPa, by using a hot press apparatus, thereby having made an SiC porous body whose relative density is 70%.

Next, Ag powder and Ag solder powder were blended so as to be composed as shown in Table XXV below, and were press-molded at a pressure level of 800 MPa. The respective obtained molded bodies were placed on the above-described SiC porous body and were heated, for one hour, at a temperature of 1000° C. in a vacuum state whose pressure is $1\times10^{-5}$ torr, whereby the molded bodies were melted. Then, the melted metal was infiltrated into the porous body, thereby having produced test samples 66 through 68 of a composite material A, which are shown in Table XXIV.

These composite materials A were heated, for two hours, at a temperature of 1250° C. in a vacuum state whose pressure is $1\times10^{-3}$ torr in order to volatilize melted metallic constituents to make the same into porous bodies again. After that, the above-described molded bodies of Ag powder or Cu powder were placed on these porous bodies and were heated, for one hour, in a vacuum state whose pressure is $1\times10^{-5}$ torr at a temperature of 1000° C. Respective test samples 69 through 74 of composite materials B shown in Table XXIV were produced by impregnating the porous bodies with melted metal again.

TABLE XXIII

| Test sample | Density (%) | Carbide (vol %) | Layer thickness (μm) | Thermal conductivity (W/mK) | | Coefficient of thermal expansion (ppm/° C.) | |
|---|---|---|---|---|---|---|---|
| | | | | In-plane direction | Thickness direction | In-plane direction | Thickness direction |
| 62 | 83.3 | 9.54 | 0.33 | 725 | 123 | 5.1 | 11.4 |
| 63 | 87.2 | 12.50 | 0.44 | 650 | 142 | 6.3 | 12.5 |
| 64 | 90.3 | 17.21 | 0.61 | 568 | 167 | 7.8 | 13.7 |
| 65 | 93.4 | 25.88 | 0.95 | 479 | 200 | 10.0 | 15.0 |

TABLE XXIV

| Test sample | SiC grain size (μm) | Amount of SiC (vol %) | Amount of Ag (vol %) | Sold amount of Ag (vol %) |
|---|---|---|---|---|
| 66 (Material A) | 200.0 | 70.4 | 12.5 | 17.2 |
| 67 (Material A) | 300.0 | 70.7 | 18.0 | 11.3 |
| 68 (Material A) | 500.0 | 70.9 | 22.1 | 7.0 |
| 69 (Material B) | Pure Ag is infiltrated in test sample 66 | | | |
| 70 (Material B) | Pure Ag is infiltrated in test sample 67 | | | |
| 71 (Material B) | Pure Ag is infiltrated in test sample 68 | | | |
| 72 (Material B) | Pure Cu is infiltrated in test sample 66 | | | |
| 73 (Material B) | Pure Cu is infiltrated in test sample 67 | | | |
| 74 (Material B) | Pure Cu is infiltrated in test sample 68 | | | |

The respective test samples of the obtained composite materials A and B were cut to a size of 10 mm diameter×2 mm thick. After the density was measured, the thermal conductivity was measured by the laser flash method. Also, the respective test samples were cut to a size of 5 mm diameter×10 mm thick. After the density was measured, and the coefficient of thermal expansion was measured by a differential transformer thermal expansion coefficient measuring device. Also, the cutting of these test samples was carried out for both the direction along which the thickness direction of the composite material is made coincident with the thickness direction of the test samples and the direction for which the thickness direction of the composite material and the thickness direction of the test samples become perpendicular to each other. In addition, the boundary phase between the SiC grains of the respective test samples and metal was observed by a transmission electron microscope to measure the thickness of a carbide (TiC) layer. Table XXV shows the results thus obtained.

TABLE XXV

| Test sample | Density (%) | Carbide (vol %) | Layer thickness (μm) | Thermal conductivity (W/mK) | | Coefficient of thermal expansion (ppm/° C.) | |
|---|---|---|---|---|---|---|---|
| | | | | In-plane direction | Thickness direction | In-plane direction | Thickness direction |
| 66 | 100.2 | 1.21 | 0.41 | 303 | 303 | 5.9 | 5.9 |
| 67 | 99.7 | 0.79 | 0.40 | 317 | 317 | 5.9 | 5.9 |
| 68 | 99.2 | 0.49 | 0.41 | 328 | 328 | 5.9 | 5.9 |
| 69 | 100.0 | 1.21 | 0.41 | 315 | 315 | 5.9 | 5.9 |
| 70 | 99.8 | 0.79 | 0.40 | 326 | 326 | 5.9 | 5.9 |
| 71 | 100.0 | 0.49 | 0.41 | 340 | 340 | 5.9 | 5.9 |
| 72 | 100.0 | 1.21 | 0.41 | 310 | 310 | 5.9 | 5.9 |
| 73 | 99.8 | 0.79 | 0.40 | 320 | 320 | 5.9 | 5.9 |
| 74 | 100.0 | 0.49 | 0.41 | 332 | 332 | 5.9 | 5.9 |

Judging from the above-described results, it was understood that the larger the mean grain size of the SiC grains used becomes, the further the thermal conductivity of the composite material is increased, and the thermal conductivity of the composite material B is higher than that of the composite material A.

Example 15

The composite materials A and B were produced as in the Example 14, except that crushed powder of SiC monocrystal wafer is used as SiC raw material powder. That is, SiC monocrystal wafer 50 mm diameter×10 mm thick, which was produced by a sublimation method was crushed to produce respective types of SiC powder whose means grain sizes are, respectively, 200, 300 and 500 μm. The thermal conductivity of the wafer before being crushed was 490 W/m·K. Table XXVI below shows the mean grain sizes and compositions of SiC powder with respect to the respective test samples 75 through 77 of the composite material A and test samples 78 through 83 of the composite material B.

TABLE XXVI

| Test sample | SiC grain size (μm) | Amount of SiC (vol %) | Amount of Ag (vol %) | Sold amount of Ag (vol %) |
|---|---|---|---|---|
| 75 (Material A) | 200.0 | 70.4 | 12.5 | 17.2 |
| 76 (Material A) | 300.0 | 70.7 | 18.0 | 11.3 |
| 77 (Material A) | 500.0 | 70.9 | 22.1 | 7.0 |
| 78 (Material B) | Pure Ag is infiltrated in test sample 75 | | | |
| 79 (Material B) | Pure Ag is infiltrated in test sample 76 | | | |
| 80 (Material B) | Pure Ag is infiltrated in test sample 77 | | | |
| 81 (Material B) | Pure Cu is infiltrated in test sample 75 | | | |
| 82 (Material B) | Pure Cu is infiltrated in test sample 76 | | | |
| 83 (Material B) | Pure Cu is infiltrated in test sample 77 | | | |

As to the composite materials A and B thus obtained, the density, thermal conductivity and coefficient of thermal expansion thereof were measured as in the Example 14. Also, the boundary phase between the SiC grains of the respective test samples and metal was observed by a transmission electron microscope, and the thickness of the carbide (TiC) layer was measured. Table XXVII shows the results thus obtained. As has been made clear based on the results, remarkably high thermal conductivity was obtained by using crushed powder of SiC monocrystal wafer. Also, it is understood that the thermal conductivity of the composite material B is higher than that of the composite material A.

TABLE XXVII

| Test sample | Density (%) | Carbide (vol %) | Layer thickness (μm) | Thermal conductivity (W/mK) | | Coefficient of thermal expansion (ppm/° C.) | |
|---|---|---|---|---|---|---|---|
| | | | | In-plane direction | Thickness direction | In-plane direction | Thickness direction |
| 75 | 100.0 | 1.21 | 0.41 | 378 | 378 | 5.9 | 5.9 |
| 76 | 100.0 | 0.79 | 0.40 | 387 | 387 | 5.9 | 5.9 |
| 77 | 100.0 | 0.49 | 0.41 | 395 | 395 | 5.9 | 5.9 |
| 78 | 100.0 | 1.21 | 0.41 | 390 | 390 | 5.9 | 5.9 |
| 79 | 100.0 | 0.79 | 0.40 | 401 | 401 | 5.9 | 5.9 |
| 80 | 100.0 | 0.49 | 0.41 | 412 | 412 | 5.9 | 5.9 |
| 81 | 100.0 | 1.21 | 0.41 | 385 | 385 | 5.9 | 5.9 |
| 82 | 100.0 | 0.79 | 0.40 | 391 | 391 | 5.9 | 5.9 |
| 83 | 100.0 | 0.49 | 0.41 | 399 | 399 | 5.9 | 5.9 |

Example 16

As raw material powder, SiC powder (6H type) whose mean grain size is 20 through 100 μm, Ag powder (99.9%) whose mean grain size is 100 μm, and Ag solder powder whose mean grain size is 100 μm (Ag:98% by weight, and Ti:2% by weight) were prepared. The above-described SiC powder was inputted in a carbon mold die whose diameter is 20 mm, and was sintered, for two hours, at a pressure level of 50 MPa at a temperature of 2300° C. in an Ar gas atmosphere whose pressure is 0.1 MPa, by using a hot press apparatus, thereby having produced SiC porous bodies whose relative density is 70%. Table XXVIII below shows the mean grain size of the SiC grains used, and the mean pore size of the porous bodies thus obtained.

Next, the above-described Ag powder and Ag solder powder were blended so as to be composed as shown in Table XXVIII below, and were press-molded at a pressure level of 800 MPa. The respective obtained molded bodies were placed on the above-described SiC porous bodies and were heated, for one hour, at a temperature of 1000° C. in a vacuum state whose pressure is $1 \times 10^{-5}$ torr, whereby the molded bodies were melted. Then, the porous bodies were impregnated with the melted metal.

TABLE XXVIII

| Test sample | SiC grain size (μm) | Mean pore size (vol %) | Amount of SiC (vol %) | Amount of Ag (vol %) | Sold amount of Ag (vol %) | Infiltration pressure (Pa) |
|---|---|---|---|---|---|---|
| 84 | 20.0 | 5.0 | 69.7 | 0.0 | 30.3 | 0.0133 |
| 85 | 20.0 | 5.0 | 69.7 | 0.0 | 30.3 | $1 \times 10^5$ |
| 86 | 20.0 | 5.0 | 69.7 | 0.0 | 30.3 | $5 \times 10^5$ |
| 87 | 20.0 | 5.0 | 69.7 | 0.0 | 30.3 | $10 \times 10^5$ |

TABLE XXVIII-continued

| Test sample | SiC grain size (μm) | Mean pore size (vol %) | Amount of SiC (vol %) | Amount of Ag (vol %) | Sold amount of Ag (vol %) | Infiltration pressure (Pa) |
|---|---|---|---|---|---|---|
| 88 | 100.0 | 20.0 | 70.0 | 5.0 | 25.0 | 0.0133 |
| 89 | 100.0 | 20.0 | 70.0 | 5.0 | 25.0 | $1 \times 10^5$ |
| 90 | 100.0 | 20.0 | 70.0 | 5.0 | 25.0 | $2 \times 10^5$ |
| 91 | 100.0 | 20.0 | 70.0 | 5.0 | 25.0 | $10 \times 10^5$ |

Respective test samples 84918 of the composite material that were thus produced were cut to a size of 10 mm diameter×2 mm thick. After the density thereof was measured, the thermal conductivity thereof was measured by the larger flash method. Also, they were cut to a size of 5 mm diameter×10 mm thick. After the density thereof was measured, the coefficient of thermal expansion was measured by a differential transformer thermal expansion coefficient measuring device. In addition, the cutting of these test samples was carried out for both the direction along which the thickness direction of the composite material is made coincident with the thickness direction of the test samples and the direction for which the thickness direction of the composite material and the thickness direction of the test samples become perpendicular to each other. In addition, the boundary phase between the SiC grains of the respective test samples and metal was observed by a transmission electron microscope, and the thickness of the carbide layer was measured. Table XXIX below shows the results thus obtained. The results inform that, by adding gas pressure, the relative density of the composite material has been improved and the thermal conductivity has also been improved.

TABLE XXIX

| Test sample | Density (%) | Carbide (vol %) | Layer thickness (μm) | Thermal conductivity (W/mK) | | Coefficient of thermal expansion (ppm/° C.) | |
|---|---|---|---|---|---|---|---|
| | | | | In-plane direction | Thickness direction | In-plane direction | Thickness direction |
| 84 | 95.9 | 2.16 | 0.07 | 250 | 250 | 5.9 | 5.9 |
| 85 | 97.8 | 2.16 | 0.07 | 271 | 271 | 5.9 | 5.9 |
| 86 | 100.7 | 2.16 | 0.07 | 288 | 288 | 5.9 | 5.9 |
| 87 | 100.7 | 2.16 | 0.07 | 288 | 288 | 5.9 | 5.9 |
| 88 | 97.9 | 1.78 | 0.30 | 282 | 282 | 5.9 | 5.9 |

TABLE XXIX-continued

| Test sample | Density (%) | Carbide (vol %) | Layer thickness (μm) | Thermal conductivity (W/mK) | | Coefficient of thermal expansion (ppm/° C.) | |
|---|---|---|---|---|---|---|---|
| | | | | In-plane direction | Thickness direction | In-plane direction | Thickness direction |
| 89 | 98.3 | 1.78 | 0.30 | 296 | 296 | 5.9 | 5.9 |
| 90 | 100.4 | 1.78 | 0.30 | 312 | 312 | 5.9 | 5.9 |
| 91 | 100.4 | 1.78 | 0.30 | 312 | 312 | 5.9 | 5.9 |

What is claimed is:

1. A high thermal conductivity composite material comprising a first constituent comprising composite carbon grains, composite carbon fibers, or composite carbide grains, which have a coating layer formed on the surface thereof, and a second constituent comprising a metal including silver and/or copper;

said coating layer formed on the surface of said first constituent comprising carbide of at least a type of metal selected from the group consisting of 4A group elements, 5A group elements, and 6A group elements of the periodic table; and said high thermal conductivity composite material having a relative density of 70% or more, a thermal conductivity of 220 W/m·K or more in an in-plane direction at room temperature and is higher than a thermal conductivity in a thickness direction, and a mean coefficient of thermal expansion of 5 through $15 \times 10^6$/°C. in a thickness direction from room temperature to 200° C. and is higher than a mean coefficient of thermal expansion in an in-plane direction.

2. A high thermal conductivity composite material as set forth in claim 1, wherein said first constituent comprises composite carbide grains having a coating layer formed on the surface thereof, and the ratio of content of the carbon grains to the second constituent is 50 through 95% by volume fraction.

3. A high thermal conductivity composite material as set forth in claim 1, wherein said first constituent comprises composite carbide fibers having a coating layer formed on the surface thereof, and the ratio of content of the carbon grains to the second constituent is 30 through 95% by volume fraction.

4. A high thermal conductivity composite material as set forth in claim 1, wherein said first constituent comprises composite carbide grains having a coating layer formed on the surface thereof, and the ratio of content of the carbide grains to the second constituent is 15 through 85% by volume fraction.

5. A high thermal conductivity composite material as set forth in claim 1, wherein the thickness of the coating layer formed on the surface of said first constituent is 0.01 through 3 μm.

6. A high thermal conductivity composite material as set forth in claim 1, wherein the thickness of the coating layer formed on the surface of said first constituent is 0.05 through 1 μm.

7. A high thermal conductivity composite material as set forth in claim 1, wherein said coating layer formed on the surface of said first constituent comprises titanium carbide as its main component.

8. A high thermal conductivity composite material as set forth in claim 1, wherein said second constituent comprises silver and copper, and the ratio of content of copper in the second constituent is 20% by volume fraction or less with respect to the total amount of silver and copper, or 80% by volume fraction or more with respect to said total amount.

9. A high thermal conductivity composite material as set forth in claim 1, wherein said relative density is 95% or more, and said thermal conductivity in an in-plane direction is 250 W/m·K or more at room temperature and is higher than a thermal conductivity in a thickness direction.

10. A high thermal conductivity composite material as set forth in claim 1, wherein said relative density is 99% or more, and the thermal conductivity in an in-plane direction is 270 W/m·K or more at room temperature and is higher than a thermal conductivity in a thickness direction.

11. A semiconductor heatsink member comprising a high thermal conductivity composite material as set forth in claim 1.

12. A semiconductor device comprising a semiconductor heatsink member as set forth in claim 11.

* * * * *